United States Patent [19]

Monma et al.

[11] 3,833,429

[45] Sept. 3, 1974

[54] METHOD OF MANUFACTURING A SEMICONDUCTOR DEVICE

[75] Inventors: Yoshinobu Monma; Shigeharu Abe; Ryuichi Miwa, all of Kawasaki; Eiji Mitsushima, Yokohama, all of Japan

[73] Assignee: Fujitsu Limited, Kawasaki, Japan

[22] Filed: Nov. 28, 1972

[21] Appl. No.: 310,168

[30] Foreign Application Priority Data

Dec. 22, 1971 Japan ............................ 46-104878

[52] U.S. Cl. .................... 148/1.5, 29/578, 148/175, 148/187, 156/17, 317/235, 317/235

[51] Int. Cl. .............................................. H01l 7/44

[58] Field of Search ........... 148/1.5, 187, DIG. 175; 29/578; 156/17

[56] References Cited

UNITED STATES PATENTS

| | | | |
|---|---|---|---|
| 3,479,237 | 11/1969 | Bergh et al. | 148/187 X |
| 3,494,809 | 2/1970 | Ross | 148/187 X |
| 3,544,858 | 12/1970 | Kooi | 148/187 X |
| 3,717,514 | 2/1973 | Burgess | 148/187 X |
| 3,725,150 | 4/1973 | George | 148/187 |

OTHER PUBLICATIONS

Dhaka et al. "Masking Technique," IBM Technical Disclosure Bulletin, Vol. 11, No. 7, Dec. 1968, pp. 864,865.

*Primary Examiner*—L. Dewayne Rutledge
*Assistant Examiner*—J. M. Davis
*Attorney, Agent, or Firm*—Daniel Jay Tick

[57] ABSTRACT

A high speed bipolar transistor with a small base area is produced by silicon nitride double films formed on a silicon substrate. The upper nitride film has a window for base diffusion and the lower nitride film has a window for emitter diffusion which overlaps the base diffusion window. The emitter diffusion occurs only in the overlapped portion of the base diffusion window and the emitter diffusion window. The diffusion source used for emitter diffusion is removed by using the nitride film as a mask.

20 Claims, 14 Drawing Figures

METHOD OF MANUFACTURING A SEMICONDUCTOR DEVICE

BACKGROUND OF THE INVENTION

The present invention relates to a method of manufacturing a semiconductor device. More particularly, the invention relates to the method of manufacturing a semiconductor device in which the base area and emitter area may be reduced.

Although a semiconductor integrated circuit permits high density mounting of circuit elements, it is desirable for higher density and higher speed due to the requirements of large scale integrated circuits and high speed integrated circuits. A transistor, which is the important functional element in semiconductor circuits, has the structure of a planar transistor which is formed by double diffusion. The emitter electrode window and base electrode window are provided in the base surface region. The emitter electrode window is further provided in the emitter surface region.

In the event that the size of the aforedescribed transistor is minimized in order that it may be operated at a higher speed and higher frequency, its surface pattern is reduced in a similar manner. However, the photomask should be correctly aligned for opening the diffusion window and the electrode window. The adjacent pattern is presently provided at distances of approximately 4 microns between the diffusion window and the electrode window. The reduction of the pattern is thus restricted by optical precision and precision of alignment.

The aforedescribed limitations of the semiconductor devices of the prior art have been partially overcome by utilizing silicon nitride for emitter diffusion and opening the emitter electrode window all over the diffusion window. The prior art devices are employed by a conventional method or process until the base diffusion proceeds for forming the base-collector junction. The silicon nitride film is then formed over the entire surface and the window for emitter diffusion and the window for the base electrode are formed in the silicon nitride film by utilizing silicon dioxide as a selective etching mask. Silicon oxide in the emitter diffusion window is then removed by a photoetching method to expose the surface of the silicon. After the diffusion of the emitter, the wafer is dipped into etching liquid of fluoric acid type to remove the silicon dioxide formed in the emitter diffusion window upon the diffusion of the emitter utilizing the etchant resistant property of silicon nitride. This provides an emitter electrode window having the same area as that of the emitter diffusion window. At the same time, silicon oxide in the base electrode window is removed to provide a base electrode window.

In the aforedescribed method for improving semiconductor devices of the prior art, the base area may be reduced by making the area of the emitter electrode window equal to the area of the minimum window, which is the emitter electrode window formed in the emitter of the conventional planar transistor. It is thus possible to provide an integrated circuit with higher speed than the integrated circuit of conventional planar transistor structure.

The principal object of the present invention is to provide a method of manufacturing a transistor in which the base area may be reduced and the emitter area may be the same as a conventional emitter area.

An object of the invention is to provide a method of manufacturing a transistor in which the emitter diffusion window may be aligned with ease, facility and convenience, without the need for adhering to the precision requirements of the prior art devices.

Another object of the invention is to provide a method of manufacturing an integrated circuit with higher speed.

Still another object of the invention is to provide a method of manufacturing a semiconductor device having a protected surface and therefore operating with greater reliability.

Yet another object of the invention is to provide a method of manufacturing a semiconductor device which avoids damage to the wafer and failure of mask alignment.

Another object of the invention is to provide a method of manufacturing a semiconductor device which avoids unnecessary base diffusion and/or unnecessary emitter diffusion and thereby improves the manufacturing yield.

BRIEF SUMMARY OF THE INVENTION

In accordance with the invention, a method of manufacturing a semiconductor device comprises the steps of forming a first insulation film having a first window on a silicon semiconductor substrate, forming a silicon oxide film on the surface of the silicon substrate in the first window, forming a second insulation film having a second window which partially overlaps the first window and extends over the first insulation film, and selectively removing the silicon oxide film exposed in the overlapped portion of the first and second windows by using the first and second insulation films as masks and forming a third window in the silicon oxide film.

BRIEF DESCRIPTION OF THE DRAWINGS

In order that the invention may be readily carried into effect, it will now be described with reference to the accompanying drawings, wherein:

FIG. 4 is a cross-sectional view of a wafer on which an oxide film and a silicon nitride layer are formed to provide an epitaxial wafer having a buried diffusion region;

FIG. 5 is a cross-sectional view of the wafer in which the silicon nitride layer is patterned;

FIG. 6 is a cross-sectional view of the wafer having resistant deposited thereon having windows therein for isolation diffusion;

FIG. 7 is a cross-sectional view of the wafer in which isolation diffusion is provided after photoetching;

FIG. 8 is a cross-sectional view of the wafer in which collector contact diffusion is provided;

FIG. 9 is a cross-sectional view of the wafer after base diffusion;

FIG. 10 is a cross-sectional view of the wafer in which a silicon nitride layer is formed and provided with patterning;

FIG. 11 is a plan view of the wafer of FIG. 10;

FIG. 12 is a cross-sectional view of the wafer after diffusion of the emitter;

FIG. 13 is a cross-sectional view of the wafer of FIG. 11, taken along the lines XIII — XIII of FIG. 11; and FIG. 14 is a cross-sectional view of the wafer in which the electrode windows are opened for wiring at the surface of the wafer.

DETAILED DESCRIPTION OF THE INVENTION

Figures 1, 2, 3:
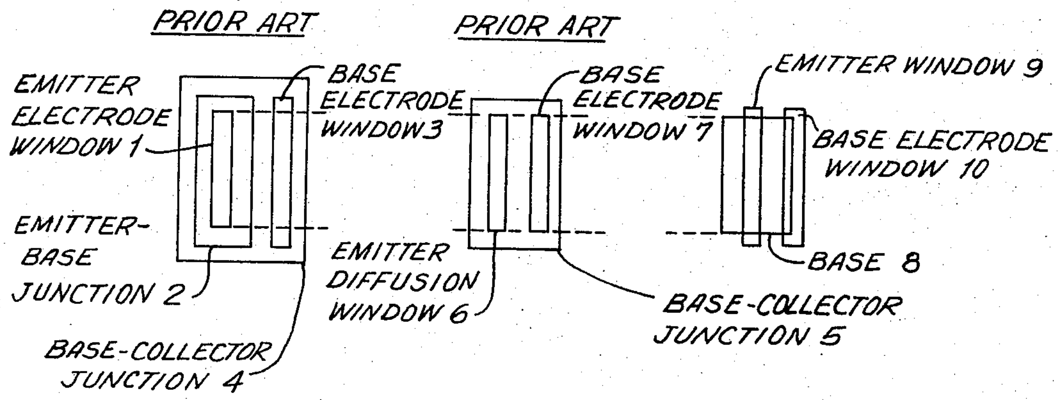
FIG. 1 is a top plan view of the surface pattern of a conventional planar transistor.
FIG. 2 is a top plan view of the surface pattern of an improved conventional planar transistor.
FIG. 3 is a top plan view of the surface pattern of the transistor of the invention.

The invention may be clearly explained with reference to semiconductor devices known in the art, as shown in FIGS. 1 and 2. In FIG. 1, the semiconductor device has an emitter electrode window 1, an emitter-base junction 2, a base electrode window 3 and a base-collector junction 4. In FIG. 2, the semiconductor device has a base-collector junction 5, an emitter diffusion window 6 and a base electrode window 7. The emitter diffusion window 6 also functions as an emitter electrode window, since the silicon oxide film formed in said window during emitter diffusion is removed.

As shown in FIGS. 1 and 2, after the base diffusion, an emitter window and a base electrode window are provided in the base during the manufacture of the transistor. It is necessary that the emitter diffusion mask, which is smaller than the base diffusion mask, be aligned.

In the method of the present invention, as illustrated in FIG. 3, a mask is utilized to define the emitter window apart from the conventional concept hereinbefore described. A base 8 is formed by base diffusion by using a first insulation film different from the silicon oxide film. The silicon oxide film is formed at the surface of the base 8 at the time of base diffusion or after base diffusion. A second insulation film, different from the silicon oxide film, is formed prior to emitter diffusion. As shown in FIG. 3, an emitter window 9 and a base electrode 10 are provided in the second insulation film.

The emitter window 9 overlaps and intersects the base 8 and may be longer than the width of the base 8. It is preferable that the emitter window 9 be longer in order to enable easy alignment of the photomask in the formation of said window. The base electrode window 10 has the same configuration as the emitter window 9. In providing the windows 9 and 10, there is danger of a first insulating film being etched if the first and second insulating films are of the same quality. In order to avoid such a danger, an underlaying insulating layer having a quality different from the first and second insulating films may be placed between said first and second insulating films.

Etching resistant or resist having an exposed portion of a larger area than that of the emitter window 9 is then applied to the wafer and the wafer is dipped into etching liquid for etching the silicon oxide. In the etching process, the first insulation film and the second insulation film are different from the silicon oxide film and are not substantially attacked by the etching liquid. Therefore, if the emitter window 9 of the second insulation film is large, the first insulation film, which is the mask for the base diffusion, functions as a mask. As a result, silicon oxide film is removed only from the portion in which the base 8 and the emitter window 9 overlap. Emitter diffusion occurs in the overlapping portion. The first insulation film at the edge of the emitter window 9 is the mask for the base diffusion and also functions as the mask for the emitter diffusion. Thus, the emitter is not larger than the base.

The base electrode window 10 partially overlaps the first insulation film. However, the silicon oxide film in the lower layer formed by base diffusion functions as the mask for the emitter diffusion. The emitter electrode window and the base electrode window are opened in a similar manner to that of the emitter window in the aforedescribed emitter diffusion. Etching resistant having an exposed portion wider than that of the window area is applied to each of the emitter window 9 and the base electrode window 10. The unit is dipped into etching liquid to remove the exposed silicon oxide film.

Alternatively, etching resistant having a wide exposed portion including the emitter window 9 and the base electrode window 10 is applied. The resistant need not be applied at all. In such case, the wafer is dipped into the etching liquid to remove the silicon oxide film in the emitter window 9 and the base electrode window 10 simultaneously. The emitter electrode window and the base electrode window are then opened and metal contacts are provided therein.

The device of the prior art, as shown in FIG. 2 is compared with the diffusion of the invention, as shown in FIG. 3. The intersected portion of the emitter window 9 and the base 8 forms the emitter. The base is formed in width of approximately the same size as the emitter, in accordance with the invention, as shown in FIG. 3. Therefore, in the method of the invention, it is not necessary to provide an allowance of 4 microns in order to space the mask for use in forming the base and emitter in order to attain the precision of alignment shown in FIG. 2. Accordingly, the required area for the base may be reduced, as shown in FIG. 3. The required area for producing a transistor is thus reduced and when the method of the invention is applied to the production of an integrated circuit, it provides additionally higher density and a higher speed integrated circuit due to the reduction of the base-collector capacity.

The semiconductor device of the invention, be it a transistor or an integrated circuit, is protected at its surface, for example, by double films of silicon nitride different from the silicon oxide film. This assures higher reliability of the device. The method of the invention eliminates the necessity for opening the emitter window and the base electrode window by photoetching. It thus avoids damage to the wafer and also avoids failure of the mask alignment at this stage of the process. Even if there is a pin hole in the first insulation layer due to scars in the mask, such pin hole will not cause unnecessary base diffusion and a pin hole in the second insulation film will not cause unnecessary emitter diffusion. This is due to the fact that such pin holes are scarce and there is almost no probability that such pin holes will be aligned in the first and second insulation layers. The yield in manufacturing is thus considerably improved.

Furthermore, according to the invention, an underlaying insulating layer having a quality chemically different from the first and second insulating films is placed between the first insulating film and the second insulating film, and accordingly the reliable patterning of the second insulating film may be attained without any damage to the first insulating film. Therefore, the patterning may easily be provided and the high yield of production may be maintained, so that highly reliable miniature transistors may be manufactured.

Figure 4:
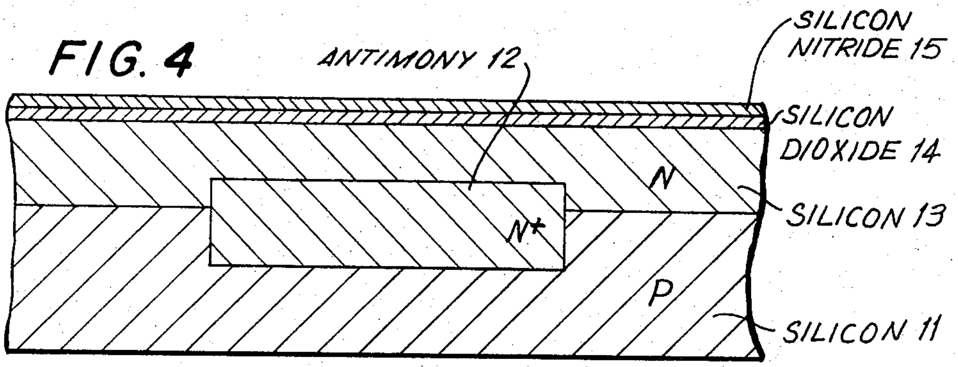
FIGS. 4 to 14 illustrate different steps in the method of the invention for manufacturing an integrated circuit and are specifically described as follows.
Figure 5:
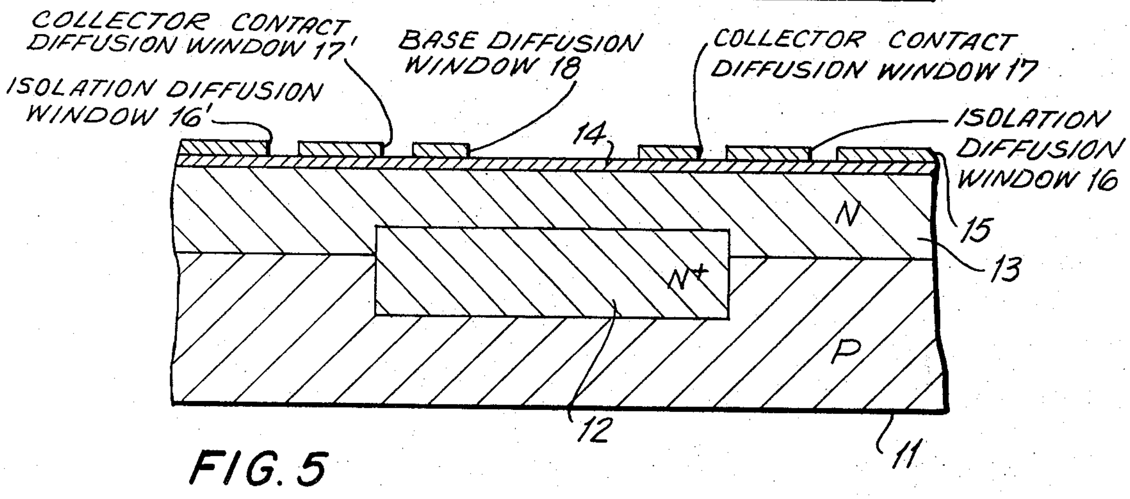

As shown in FIG. 4, a buried diffusion layer 12 is formed by diffusing antimony of high concentration into a silicon semiconductor wafer 11 of P conductivity type. A silicon epitaxial layer 13 having a thickness of 5 microns is formed on the silicon wafer 11. A silicon dioxide layer 14 having a thickness of approximately 3,000 A is formed on the silicon layer 13 by thermal oxidation. A silicon nitride layer 15 having a thickness of approximately 1,000 to 2,000 A is grown on the silicon dioxide layer 14 by chemical vapor deposition. As shown in FIG. 5, the silicon nitride layer 15 is patterned.

Resistor diffusion regions are not overlapped in any of the isolation diffusion region, the collector contact diffusion region, the base diffusion region and the adjacent island forming resistor. The mask pattern for the window openings may be provided in a single mask and said mask may be utilized to pattern the silicon nitride layer 15. The silicon nitride layer 15 is selectively etched by boiled phosphoric acid utilizing silicon dioxide as a mask. As shown in FIG. 5, isolation diffusion windows 16 and 16', collector contact diffusion windows 17 and 17' and a base diffusion window 18 are provided in the silicon nitride 15. In the illustrated example, a resistor diffusion window is, of course, formed in the adjacent island.

Figure 6:
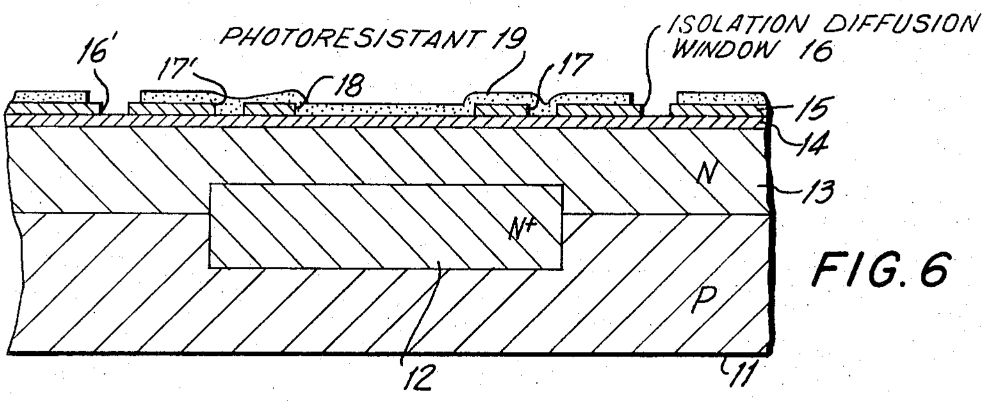

Thus, in the aforedescribed step of the method of the invention, all the relative locations, such as for example, the isolation diffusion windows 16 and 16', the collector contact diffusion windows 17 and 17', the base diffusion window 18 and the resistor diffusion window, etc., are provided. Photoresistant or photoresist 19 is then applied to the surface of the silicon nitride 15 for isolation diffusion, as shown in FIG. 6. The photoresistant 19 is applied by spin coating, is covered by a photomask and exposed therethrough, and is developed and removed in a specific area to form the isolation diffusion windows 16 and 16'. There is no necessity to align the mask with high precision in this step of the method of the invention. Since the silicon nitride layer 15 withstands the conventional etching liquid for the silicon dioxide, only such silicon dioxide in the isolation diffusion window 16 is removed.

Figure 7:
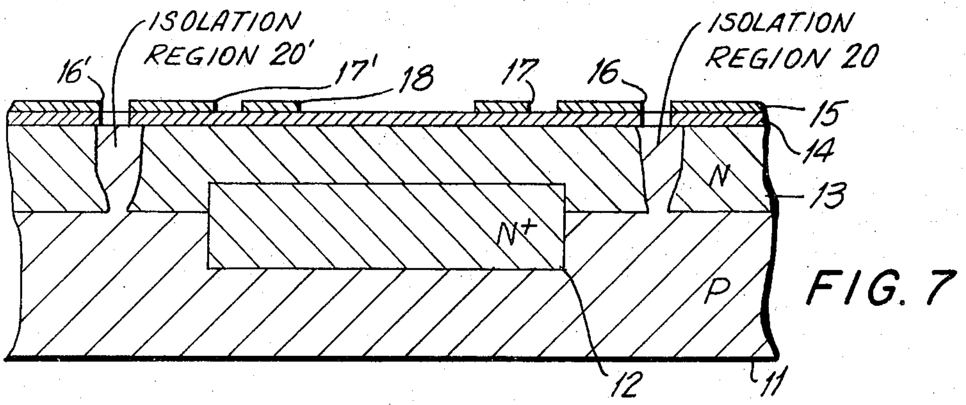

Isolation regions 20 and 20' are formed in the silicon substrate 11, as shown in FIG. 7, by the usual boron diffusion treatment. Silicon in the isolation diffusion windows 16 and 16' is simultaneously oxidized by the boron diffusion treatment and results in a new silicon oxide film. Photoresistant 19 is applied for the collector contact diffusion by spin coating, in the same manner as in FIG. 6. Silicon dioxide only in the collector contact diffusion windows 17 and 17' is removed. The silicon dioxide is removed from an area a little wider than that of either of the collector contact diffusion windows 17 and 17'.

Figure 8:
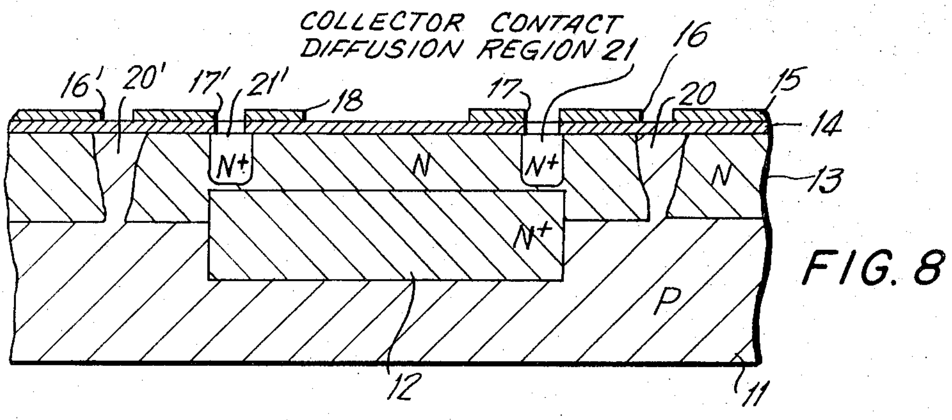

Collector contact diffusion regions 21 and 21' are formed in the silicon epitaxial layer 13 by the conventional phosphorus diffusion treatment and new silicon oxides are formed on the surface of the silicon, as shown in FIG. 8.

Figure 9:
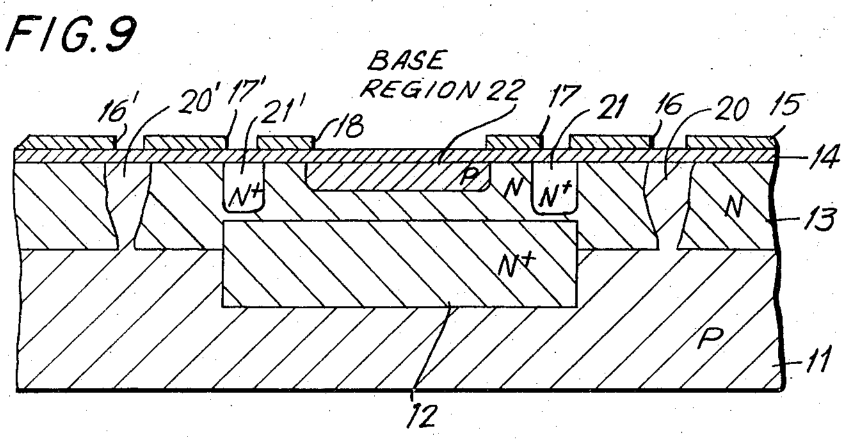

After the photoresistant is applied in the manner illustrated in FIG. 6, silicon dioxide is removed only from the base diffusion window 18, as shown in FIG. 9, by removing it from an area a little wider than that of the resistor diffusion window in said base diffusion window and in the island forming resistor. A base region 22 and the resistor diffusion region are then formed by the conventional boron diffusion treatment and a new silicon oxide film is formed on the surface of the silicon.

Figure 10:
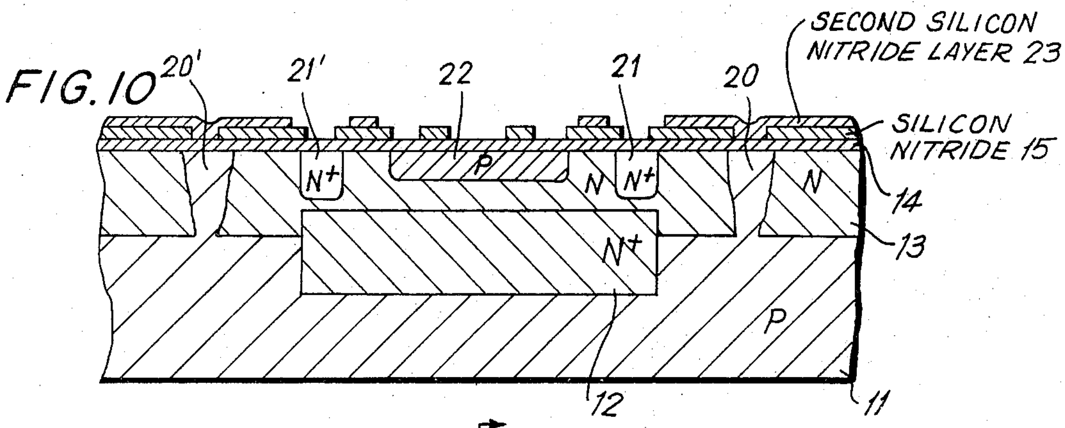
Figure 11:
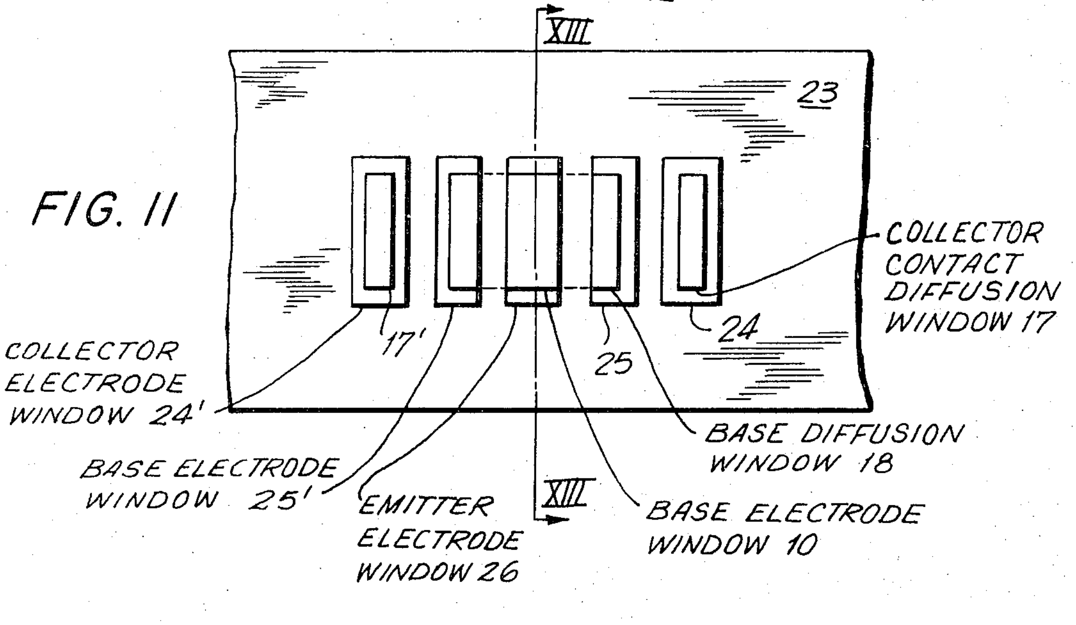

The method of the invention produces vapor growth of a second silicon nitride layer 23 on the silicon nitride layer 15. The second silicon nitride layer 23, as shown in FIG. 10, has a thickness of approximately 1,000 to 2,000 A and covers the surface of the silicon nitride 15 and part of the surface of the silicon dioxide 14 in a pattern. FIG. 11 is a plan view of the semiconductor device of FIG. 10 and shows collector electrode windows 24 and 24', base electrode windows 25 and 25' and an emitter electrode window 26. The windows 24 and 24', 25 and 25' and 26 are longer than the collector contact diffusion windows 17 and 17' and the base diffusion window 18 thereunder, also shown in FIG. 11. The base electrode windows 25 and 25' and the emitter electrode window 26 overlap and intersect the base diffusion window 18. The base electrode windows 25 and 25' and the emitter electrode window 26 are not formed in the base diffusion window 18. The width of the emitter electrode window 26 is important, but the length thereof is not essential, as long as it intersects the base diffusion window 18.

After the photoresistant is applied, as shown in FIG. 6, and prior to the emitter diffusion, said photoresistant is removed from an area a little wider than that of the emitter electrode window 26. The wafer is then dipped into etching liquid of fluoric acid type for silicon oxides. The second silicon nitride layer 23 and the silicon nitride layer 15 thereunder are not etched, so that silicon oxide exposed only at the overlapping portion of the base diffusion window 18 and the emitter electrode window 26 is removed to expose the silicon surface. Thereafter, emitter diffusion is provided in a conventional vapor diffusion process and a new silicon oxide film is simultaneously formed on the surface.

Figure 12:
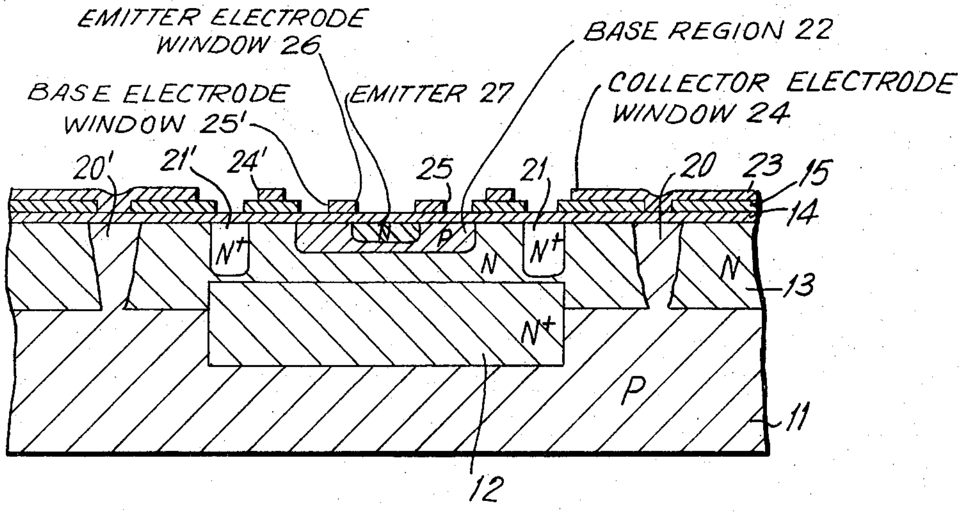
Figure 13:
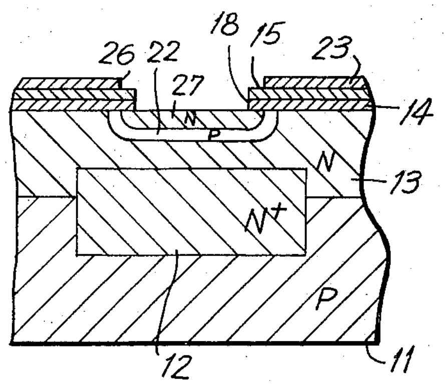

FIG. 12 is a cross-sectional view of the wafer after emitter diffusion, and shows an emitter 27. FIG. 13 is a cross-sectional view of the wafer taken along the line XIII—XIII of FIG. 11. The base and emitter diffusion in the section shown in FIG. 13 is substantially restricted by the lower layer 15 of silicon nitride, and both layers of silicon nitride 15 and 23 come closer, but there is no resultant difficulty in operation. Furthermore, it is possible, by the aforedescribed emitter diffusion, to position the emitter and base very close to each other and absolutely without the necessity for providing an allowance for the alignment required when the emitter is positioned in the base after the base is formed, as in the known processes. The alignment allowance in the conventional processes is usually approximately 3 to 4 microns. The base area may therefore be reduced by as much as is required for the alignment allowance with the emitter area being the same as that of conventional emitter areas.

The base electrode windows 25 and 25' overlap the base diffusion window 18 at least partially, and in the illustrated example, both ends of the base diffusion window 18 are positioned in the base electrode windows 25 and 25' thereby minimizing the base area. As a result, the emitter area is 4 by 16 microns and the base area is 16 by 26 microns in the illustrated example. On the other hand, however, in the improved transistor of the prior art having the surface pattern shown in FIG. 2, the base width is 24 microns, since each 4 microns allowance is provided for both sides to a width of 16 microns and the length is 30 microns; the emitter area being the same. This means that the area of the device of the invention is reduced up to 58 percent compared to the known improved transistor.

Furthermore, all of the necessary windows such as, for example, the isolation diffusion windows 16 and 16', the collector contact diffusion windows 17 and 17', the base diffusion window 18 and the resistor diffusion window, etc., are formed in the same silicon nitride layer 15 in the illustrated example, so that the relative locations of these windows are fixed and do not deviate due to the opening of the windows thereafter. It is not necessary to align the mask for each window opening as precisely as in the known or conventional processes, and it is possible to design a pattern which eliminates the necessity for precision of alignment. Since the method of the invention may eliminate the allowance of 3 to 4 microns necessary in the conventional process, as hereinbefore described, a considerable reduction in area may be achieved, as a result of the reduction in the base area, especially, for example, in a large scale integrated circuit where hundreds of transistors are provided.

As shown in FIG. 12, when the emitter diffusion is completed, contacts are provided and electrode leads are wired to the contacts. In the present example, a resistant or resist having a wide exposed portion for the collector electrode windows 24 and 24' at both ends, is provided, as shown in FIG. 11, for the sake of simplicity and all exposed silicon oxide on the surface of the wafer is removed. Since the surface of the wafer is masked by the second silicon nitride layer 23 and the lower silicon nitride layer 15, silicon oxide is removed only from the overlapped portion of the windows of the silicon nitride layers 23 and 15.

Figure 14:
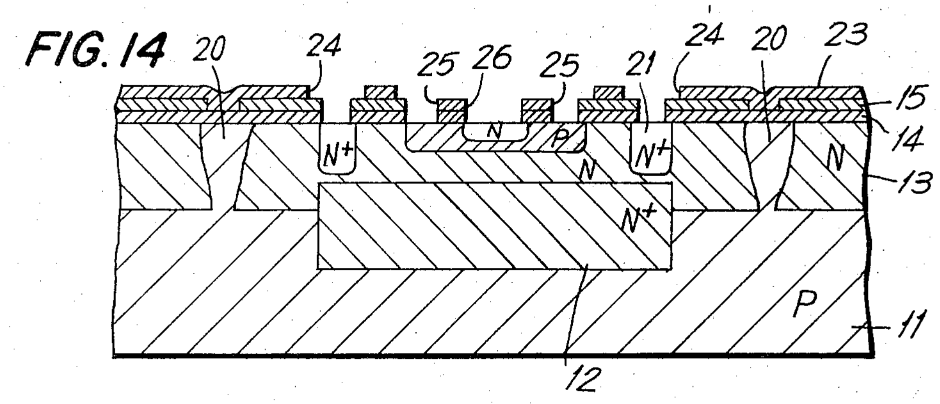

FIG. 14 is a cross-sectional view of the wafer after it has etched. Contacts are provided on the exposed surface of the silicon in a known manner and electrode leads are connected to the contacts at the surface of the wafer.

Although the invention insulation been described in specific embodiments, various modifications based on the concept of the invention are possible. Thus, for example, the silicon nitride layers 15 and 23 may be replaced by aluminum oxide. It is also possible to remove all of the silicon nitride layer and the silicon dioxide layer on the surface of the wafer when the base diffusion is completed and then form a new lower film of silicon dioxide to protect the surface and a different layer of silicon nitride to apply the same pattern configuration. Furthermore, after the silicon oxide exposed only in the overlapping portions of the base diffusion window 18 and the emitter electrode window 26 has been removed, the emitter diffusion may be provided by various processes other than vapor diffusion. Thus, for example, the emitter diffusion may be provided by utilizing polysilicon or silicate glass doped with impurities. Such emitter diffusion source is then etched after diffusion, using the first and second insulation films as masks for the silicon oxide film formed in the vapor diffusion. Fluoric acid and a mixed solution of fluoric acid dissolves polysilicon and a solution of fluoric acid dissolves various types of glass, but neither dissolves the first and second insulation films.

In order to completely eliminate over-etching of the first silicon nitride layer 15 in the aforedescribed embodiment, an underlying layer having a quality different from the first and second silicon nitride layers, for example, silicon dioxide with a thickness of about 500A, may be placed between said first and second silicon nitride layers after the base diffusion illustrated in FIG. 9. Said underlying layer is formed on the entire surface of the substrate and the second silicon nitride layer 23 is formed on the underlying layer. The patterning of the second silicon nitride layer 23 is undertaken in boiled phosphoric acid. At such time, the underlying layer functions to stop etching, so that the etching of the first silicon nitride may be prevented.

While the invention has been described by means of specific examples and in specific embodiments, we do not wish to be limited thereto, for obvious modifications will occur to those skilled in the art without departing from the spirit and scope of the invention.

We claim:

1. A method of manufacturing a semiconductor device, comprising the steps of forming a first insulation film having a first window on a silicon semiconductor substrate;

forming a silicon oxide film on the surface of the silicon in the first window;

forming a second insulation film having a second window which partially overlaps the first window and extends over the first insulation film; and selectively removing the silicon oxide film exposed in the overlapped portion of the first and second windows by using the first and second insulation films as masks and forming a third window in the silicon oxide film.

2. A method as claimed in claim 1, wherein each of the first and second insulation films comprises silicon nitride.

3. A method as claimed in claim 1, wherein each of the first and second insulation films comprises aluminum oxide.

4. A method as claimed in claim 1, further comprising the step of diffusing impurities through the third window.

5. A method as claimed in claim 1, further comprising the step of providing electrical contacts on the surface of the silicon in the third window.

6. A method of manufacturing a semiconductor device, comprising the steps of forming a first insulation film having a first window on a silicon semiconductor substrate;

diffusing first impurities through the first window;

forming a silicon oxide film on the surface of the silicon in the first window;

forming a second insulatin layer having a second window which partially overlaps the first window and extends over the first insulation film;

selectively removing the silicon oxide film exposed in the overlapped portion of the first and second windows by using the first and second insulation films as masks and forming a third window in the silicon oxide film; and diffusing second impurities through the third window.

7. A method as claimed in claim 6, wherein each of the first and second films comprises silicon nitride.

8. A method as claimed in claim 6, wherein each of the first and second films comprises aluminum oxide.

9. A method as claimed in claim 6, further comprising the steps of providing electrical contacts on the surface of the silicon in the third window.

10. A method as claimed in claim 6, further comprising the steps of forming a silicon oxide film on the surface of the silicon in the third window during the diffusion of the second impurities, selectively removing the silicon oxide film in the third window using the first and second insulation films as masks, and providing electrical contacts on the surface of the silicon in the third window.

11. A method of manufacturing a transistor, comprising the steps of forming a first insulation film having a base window on a silicon semiconductor substrate having a surface layer of one conductivity type;

forming a base by diffusing impurities of the opposite conductivity type to that of the surface layer through the base window;

forming a silicon oxide film on the silicon surface in the base window;

forming a second insulation film having a window for emitter formation which partially overlaps the base window and extends over the first insulation film;

selectively removing the silicon oxide film exposed in the overlapped portion of the base window and the window for emitter formation by using the first and second insulation films as masks and forming an emitter window in the silicon oxide film; and forming the emitter by diffusing impurities of the same conductivity type as that of the surface layer through the emitter window.

12. A method as claimed in claim 11, wherein each of the first and second insulation films comprises silicon nitride.

13. A method as claimed in claim 11, wherein each of the first and second films comprises silicon aluminum.

14. A method as claimed in claim 11, further comprising the steps of forming a silicon oxide film on the surface of the silicon in the emitter window during the emitter formation, providing an emitter contact window by selectively removing the silicon oxide film in the emitter window, using the first and second insulation films as masks, and providing an emitter electrode contact on the emitter surface in the emitter contact window.

15. A method as claimed in claim 11, further comprising the step of providing a window for base electrode formation adjacent to the window for emitter formation in the second insulation film.

16. A method as claimed in claim 11, further comprising the steps of providing a window for base electrode formation adjacent to the window for emitter formation in the second insulation film, forming a silicon oxide film on the surface of the silicon in the emitter window during emitter formation, selectively removing the silicon oxide film in the emitter window by using the first and second insulation films as masks to provide an emitter contact window, providing an emitter electrode contact on the emitter surface in the emitter contact window, selectively removing the silicon oxide film in the base window by using the first and second insulation films as masks to provide a base contact window, and providing a base electrode contact on the base surface in the base contact window.

17. A method of manufacturing an integrated circuit, comprising the steps of providing a buried diffusion region in a silicon epitaxial substrate;

forming a silicon oxide film on one surface of the epitaxial substrate;

forming a first insulation film having a base window;

forming an isolation diffusion window surrounding the base window;

selectively removing the silicon oxide film in the isolation diffusion window by using the first insulation film as a mask;

providing isolation diffusion through the isolation diffusion window;

removing the silicon oxide film in the base window by using the first insulation film as a mask; and forming a base by diffusing impurities through the base window.

18. A method as claimed in claim 17, further comprising the steps of forming a second insulation film having a window for emitter formation which partially overlaps the base window and extends over the first insulation film, selectively removing the silicon oxide film exposed in the overlapped portion of the base window and the window for emitter formation to form an emitter window in the silicon oxide film, and forming an emitter by diffusing impurities through the emitter window.

19. A method as claimed in claim 17, further comprising the step of providing a collector contact diffusion window in the first insulation film.

20. A method as claimed in claim 17, further comprising the steps of providing a window for resistor diffusion in another island portion of the first insulation film.

* * * * *